United States Patent
Shilane et al.

(10) Patent No.: US 10,521,123 B2
(45) Date of Patent: *Dec. 31, 2019

(54) ADDITIVE LIBRARY FOR DATA STRUCTURES IN A FLASH MEMORY

(71) Applicant: EMC IP Holding Company LLC, Hopkinton, MA (US)

(72) Inventors: Philip N. Shilane, Newtown, PA (US); Grant R. Wallace, Pennington, NJ (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/209,054

(22) Filed: Dec. 4, 2018

(65) Prior Publication Data

US 2019/0107946 A1    Apr. 11, 2019

Related U.S. Application Data

(63) Continuation of application No. 15/196,283, filed on Jun. 29, 2016, now Pat. No. 10,146,438.

(51) Int. Cl.
  *G06F 3/06*   (2006.01)
  *G06F 16/901*   (2019.01)
  *G11C 16/10*   (2006.01)

(52) U.S. Cl.
  CPC ............ *G06F 3/061* (2013.01); *G06F 3/0655* (2013.01); *G06F 3/0688* (2013.01); *G06F 16/9014* (2019.01); *G06F 16/9024* (2019.01); *G11C 16/10* (2013.01); *G11C 16/102* (2013.01)

(58) Field of Classification Search
  CPC ............... G06F 3/00; G06F 3/06–0602; G06F 3/061–0613; G06F 3/0628–0653; G06F 3/0655–0667; G06F 3/0668–0688; G06F 3/0689; G06F 11/00–3696; G06F 12/00–16; G06F 13/00–4295; G06F 17/30–30946; G06F 17/30949–30955; G06F 17/30958–30997; G06F 2003/0691–0698; G06F 2212/00–7211; G11C 7/00–24; G11C 16/00–04; G11C 16/10–24; G11C 16/26–32; G11C 16/34–3495

See application file for complete search history.

(56) References Cited

U.S. PATENT DOCUMENTS

| | | |
|---|---|---|
| 4,513,367 A | 4/1985 | Chan |
| 4,785,395 A | 11/1988 | Keeley |
| 5,333,318 A | 7/1994 | Wolf |
| 5,590,320 A | 12/1996 | Maxey |
| 5,630,093 A | 5/1997 | Holzhammer |
| 5,644,701 A | 7/1997 | Takewaki |

(Continued)

OTHER PUBLICATIONS

U.S. Appl. No. 15/196,150, filed Jun. 29, 2016, Shilane, et al.

(Continued)

*Primary Examiner* — Daniel C. Chappell
(74) *Attorney, Agent, or Firm* — Workman Nydegger

(57) ABSTRACT

Systems and methods for managing data structures in a flash memory. A library is provided that supports read requests and write requests. The library allows reads and writes to be implemented without requiring the client to understand how the data structure is implemented in the flash memory.

20 Claims, 10 Drawing Sheets

(56) References Cited

U.S. PATENT DOCUMENTS

| | | |
|---|---|---|
| 5,682,497 A | 10/1997 | Robinson |
| 5,684,976 A | 11/1997 | Soheili-Arasi |
| 5,740,349 A | 4/1998 | Hasbun |
| 5,761,501 A | 6/1998 | Lubbers |
| 5,838,614 A | 11/1998 | Estakhri |
| 5,907,856 A | 5/1999 | Estakhri |
| 5,909,694 A | 6/1999 | Gregor |
| 5,913,226 A | 6/1999 | Sato |
| 5,966,726 A | 10/1999 | Sokolov |
| 6,046,936 A | 4/2000 | Tsujikawa |
| 6,049,672 A | 4/2000 | Shiell |
| 6,119,209 A | 9/2000 | Bauman |
| 6,128,623 A | 10/2000 | Mattis |
| 6,192,450 B1 | 2/2001 | Bauman |
| 6,216,199 B1 | 4/2001 | DeKoning |
| 6,272,593 B1 | 8/2001 | Dujari |
| 6,360,293 B1 | 3/2002 | Unno |
| 6,510,083 B1 | 1/2003 | See |
| 6,594,723 B1 | 7/2003 | Chapman |
| 6,636,950 B1 | 10/2003 | Mithal |
| 6,807,615 B1 | 10/2004 | Wong |
| 6,851,015 B2 | 2/2005 | Akahane |
| 6,901,499 B2 | 5/2005 | Aasheim |
| 6,965,970 B2 | 11/2005 | Mosur |
| 6,978,342 B1 | 12/2005 | Estakhri |
| 7,290,109 B2 | 10/2007 | Horil |
| 7,433,245 B2 | 10/2008 | Otsuka |
| 7,472,205 B2 | 12/2008 | Abe |
| 7,533,214 B2 | 5/2009 | Aasheim |
| 7,640,262 B1 | 12/2009 | Beaverson |
| 7,673,099 B1 | 3/2010 | Beaverson |
| 7,702,628 B1 | 4/2010 | Luchangco |
| 7,711,923 B2 | 5/2010 | Rogers |
| 7,720,892 B1 | 5/2010 | Healey, Jr. |
| 7,930,559 B1 | 4/2011 | Beaverson |
| 7,996,605 B2 | 8/2011 | Koga |
| 8,300,465 B2 | 10/2012 | Jeon |
| 8,533,395 B2 | 9/2013 | O'Connor |
| 8,581,876 B1 * | 11/2013 | Wickes ................ G06F 3/0605 345/173 |
| 8,583,854 B2 | 11/2013 | Ji |
| 8,606,604 B1 | 12/2013 | Huber |
| 8,634,248 B1 | 1/2014 | Sprouse |
| 8,688,650 B2 | 4/2014 | Mutalik |
| 8,688,913 B2 | 4/2014 | Benhase |
| 8,738,841 B2 | 5/2014 | Olbrich |
| 8,738,857 B1 | 5/2014 | Clark |
| 8,793,543 B2 | 7/2014 | Tai |
| 8,811,074 B2 | 8/2014 | Goss |
| 8,817,541 B2 | 8/2014 | Li |
| 8,904,117 B1 | 12/2014 | Kalekar |
| 8,910,020 B2 | 12/2014 | Frayer |
| 8,917,559 B2 | 12/2014 | Bisen |
| 8,935,446 B1 | 1/2015 | Shilane |
| 8,943,282 B1 | 1/2015 | Armangau |
| 9,026,737 B1 | 5/2015 | Armangau |
| 9,043,517 B1 | 5/2015 | Sprouse |
| 9,098,420 B2 | 8/2015 | Bulut |
| 9,116,793 B2 | 8/2015 | Kandiraju |
| 9,135,123 B1 | 9/2015 | Armangau |
| 9,152,496 B2 | 10/2015 | Kanade |
| 9,171,629 B1 | 10/2015 | Kokubun |
| 9,189,402 B1 | 11/2015 | Smaldone |
| 9,189,414 B1 | 11/2015 | Shim |
| 9,213,642 B2 | 12/2015 | Chiu |
| 9,274,954 B1 | 3/2016 | Bairavasundaram |
| 9,281,063 B2 | 3/2016 | Xiang |
| 9,313,271 B2 | 4/2016 | Venkat |
| 9,317,218 B1 | 4/2016 | Botelho |
| 9,405,682 B2 * | 8/2016 | Meshchaninov ... G06F 12/0623 |
| 9,436,403 B1 | 9/2016 | Zhang |
| 9,442,662 B2 | 9/2016 | Dancho |
| 9,442,670 B2 | 9/2016 | Kruger |
| 9,524,235 B1 | 12/2016 | Sprouse |
| 9,535,856 B2 | 1/2017 | Coronado |
| 9,542,118 B1 * | 1/2017 | Lercari ................... G06F 3/064 |
| 9,690,713 B1 | 6/2017 | Khermosh |
| 9,697,267 B2 | 7/2017 | Kadayam |
| 9,703,816 B2 | 7/2017 | George |
| 9,753,660 B2 | 9/2017 | Mani |
| 9,811,276 B1 | 11/2017 | Taylor |
| 9,870,830 B1 | 1/2018 | Jeon |
| 9,952,769 B2 | 4/2018 | Badam |
| 9,959,058 B1 | 5/2018 | O'Brien |
| 10,002,073 B2 | 6/2018 | Cai |
| 10,037,164 B1 | 7/2018 | Wallace et al. |
| 10,055,150 B1 | 8/2018 | Fenol |
| 10,055,351 B1 | 8/2018 | Wallace et al. |
| 10,089,025 B1 | 10/2018 | Wallace et al. |
| 10,146,438 B1 * | 12/2018 | Shilane ................... G06F 3/061 |
| 10,146,851 B2 * | 12/2018 | Tee ....................... G06F 16/285 |
| 10,169,122 B2 * | 1/2019 | Tee ..................... G06F 11/0709 |
| 10,243,779 B2 * | 3/2019 | Tee ...................... G06F 16/9024 |
| 10,261,704 B1 | 4/2019 | Shilane et al. |
| 10,318,201 B2 | 6/2019 | Wallace et al. |
| 10,331,561 B1 | 6/2019 | Shilane et al. |
| 10,353,607 B2 | 7/2019 | Wallace et al. |
| 10,353,820 B2 | 7/2019 | Wallace et al. |
| 10,379,932 B2 * | 8/2019 | Tee ..................... G06F 11/0709 |
| 2001/0029564 A1 | 10/2001 | Estakhri |
| 2003/0009623 A1 | 1/2003 | Arimilli |
| 2003/0009637 A1 | 1/2003 | Arimilli |
| 2003/0009639 A1 | 1/2003 | Arimilli |
| 2003/0009641 A1 | 1/2003 | Arimilli |
| 2003/0009643 A1 | 1/2003 | Arimilli |
| 2003/0217227 A1 | 11/2003 | Parthasarathy |
| 2004/0123270 A1 | 6/2004 | Zhuang |
| 2005/0120180 A1 | 6/2005 | Schornbach |
| 2005/0165828 A1 | 7/2005 | Lango |
| 2006/0015768 A1 | 1/2006 | Valine |
| 2006/0059171 A1 | 3/2006 | Borthakur |
| 2006/0101200 A1 | 5/2006 | Doi |
| 2006/0143390 A1 | 6/2006 | Kottapalli |
| 2006/0179174 A1 | 8/2006 | Bockhaus |
| 2006/0184744 A1 | 8/2006 | Langston |
| 2007/0005928 A1 | 1/2007 | Trika |
| 2007/0061504 A1 | 3/2007 | Lee |
| 2007/0156842 A1 | 7/2007 | Vermeulen |
| 2007/0180328 A1 | 8/2007 | Cornwell |
| 2007/0300037 A1 | 12/2007 | Rogers |
| 2008/0046655 A1 | 2/2008 | Bhanoo |
| 2008/0065809 A1 | 3/2008 | Eichenberger |
| 2008/0077782 A1 | 3/2008 | Lataille |
| 2008/0120469 A1 | 5/2008 | Kornegay |
| 2008/0147714 A1 | 6/2008 | Breternitz |
| 2008/0177700 A1 | 7/2008 | Li |
| 2008/0183955 A1 | 7/2008 | Yang |
| 2008/0263114 A1 | 10/2008 | Nath |
| 2008/0266962 A1 | 10/2008 | Jeon |
| 2008/0273400 A1 | 11/2008 | La Rosa |
| 2008/0313132 A1 | 12/2008 | Hao |
| 2009/0063508 A1 | 3/2009 | Yamato |
| 2009/0216788 A1 | 8/2009 | Rao |
| 2009/0222626 A1 | 9/2009 | Ingle |
| 2009/0240871 A1 | 9/2009 | Yano |
| 2009/0300265 A1 | 12/2009 | Vyssotski |
| 2010/0023697 A1 | 1/2010 | Kapoor |
| 2010/0070715 A1 | 3/2010 | Waltermann |
| 2010/0082886 A1 | 4/2010 | Kwon |
| 2010/0115182 A1 | 5/2010 | Murugesan |
| 2010/0165715 A1 | 7/2010 | Donze |
| 2010/0185807 A1 | 7/2010 | Meng |
| 2010/0199027 A1 | 8/2010 | Pucheral |
| 2010/0211744 A1 | 8/2010 | Morrow |
| 2010/0229005 A1 | 9/2010 | Herman |
| 2010/0306448 A1 | 12/2010 | Chen |
| 2010/0332952 A1 | 12/2010 | Chung |
| 2011/0010698 A1 | 1/2011 | Byom |
| 2011/0022778 A1 | 1/2011 | Schibilla |
| 2011/0072217 A1 | 3/2011 | Hoang |
| 2011/0138105 A1 | 6/2011 | Franceschini |
| 2011/0138132 A1 | 6/2011 | Brueggen |
| 2011/0153953 A1 | 6/2011 | Khemani |
| 2011/0225141 A1 | 9/2011 | Chaudhry |

(56) References Cited

U.S. PATENT DOCUMENTS

| | | |
|---|---|---|
| 2011/0264865 A1 | 10/2011 | Mobarak |
| 2011/0276780 A1 | 11/2011 | Sengupta |
| 2011/0276781 A1 | 11/2011 | Sengupta |
| 2011/0296110 A1 | 12/2011 | Lilly |
| 2012/0054414 A1 | 3/2012 | Tsai |
| 2012/0084484 A1 | 4/2012 | Post |
| 2012/0102268 A1 | 4/2012 | Smith |
| 2012/0110247 A1 | 5/2012 | Eleftheriou |
| 2012/0215970 A1 | 8/2012 | Shats |
| 2012/0275466 A1 | 11/2012 | Bhadra |
| 2013/0036418 A1 | 2/2013 | Yadappanavar |
| 2013/0103911 A1 | 4/2013 | Bulut |
| 2013/0205089 A1 | 8/2013 | Soerensen |
| 2013/0282964 A1 | 10/2013 | Sengupta |
| 2013/0325817 A1 | 12/2013 | Whitehouse |
| 2013/0339576 A1 | 12/2013 | Liu |
| 2014/0013027 A1 | 1/2014 | Jannyavula Venkata |
| 2014/0098619 A1 | 4/2014 | Nazarian |
| 2014/0122818 A1 | 5/2014 | Hayasaka |
| 2014/0136762 A1 | 5/2014 | Li |
| 2014/0143505 A1 | 5/2014 | Sim |
| 2014/0149401 A1 | 5/2014 | Liu |
| 2014/0173330 A1 | 6/2014 | Samanta |
| 2014/0215129 A1 | 7/2014 | Kuzmin |
| 2014/0281167 A1 | 9/2014 | Danilak |
| 2014/0281824 A1 | 9/2014 | Oh |
| 2015/0127889 A1 | 5/2015 | Hwang |
| 2015/0205722 A1 | 7/2015 | Chiu |
| 2015/0277786 A1 | 10/2015 | Rostock |
| 2015/0331807 A1 | 11/2015 | Lie |
| 2015/0347291 A1 | 12/2015 | Choi |
| 2015/0363285 A1 | 12/2015 | Delaney |
| 2016/0041927 A1 | 2/2016 | Jung |
| 2016/0147669 A1 | 5/2016 | Huang |
| 2016/0274819 A1 | 9/2016 | Choi |
| 2017/0060439 A1 | 3/2017 | Harawasa |
| 2017/0091054 A1 | 3/2017 | Delaney |
| 2019/0243565 A1 | 8/2019 | Shilane et al. |

OTHER PUBLICATIONS

U.S. Appl. No. 15/196,261, filed Jun. 29, 2016, Shilane, et al.
U.S. Appl. No. 16/049,891, filed Jul. 31, 2018, Wallace, et al.
U.S. Appl. No. 16/103,499, filed Aug. 14, 2018, Wallace, et al.
U.S. Appl. No. 16/146,584, filed Sep. 28, 2018, Wallace, et al.
CAFTL: A Content-Aware Flash Translation Layer Enhancing the Lifespan of Flash Memory based Solid State Drives; Chen et al; Proceedings of the 9th USENIX conference on File and storage technologies; Feb. 15-17, 2011; retrieved from Proceedings of the 9th USENIX conference on File and storage technologies on Jul. 15, 2017 (14 pages).
A Forest-structured Bloom Filter with flash memory; Lu et al; IEEE 27th Symposium on Mass Storage Systems and Technologies; May 23-27, 2011 (6 pages).
Algorithms in Java, Third Edition; Sedgewick, Robert; ISBN 0-201-36120-5; 2003; pp. 91-94 (4 pages).
Skip lists: a probabilistic alternative to balanced trees; Pugh, William; Communications of the ACM, vol. 33, iss. 6; 6/19990; pp. 668-676 (9 pages).
NAND Flash Memory: Challenges and Opportunities; Li et al; IEEE Computer, vol. 46, iss. 8; Aug. 2013; pp. 23-29 (Year: 2013).
Dysource: a high performance and scalable NAND flash controller architecture based on source synchronous interface; Wu et al; Proceedings of the 12th ACM International Conference on Computing Frontiers, Article No. 25; May 18-21, 2015 (Year: 2015).
Hardware/software architecture for flash memory storage systems; Min et al; Proceedings of the 14th international conference on Compilers, architectures and synthesis for embedded systems; Oct. 9-14, 2011; pp. 235-236 (Year: 2011).
A self-adjusting flash translation layer for resource-limited embedded systems; Wu, Chin-Hsien; ACM Transactions on Embedded Computing Systems, vol. 9, iss. 4, Article No. 31; Mar. 2010 (Year: 2010).
DHash: A cache-friendly TCP lookup algorithm for fast network processing; Zhang et al; 38th Conference on Local Computer Networks; Oct. 21-24, 2013; pp. 484-491 (8 pages) (Year: 2013).
A comparison of adaptive radix trees and hash tables; Alvarez et al; 31st International Conference on Data Engineering; Apr. 13-17, 2015; pp. 1227-1238 (12 pages) (Year: 2015).
A Workload-Aware Adaptive Hybrid Flash Translation Layer with an Efficient Caching Strategy; Park et al; 19th International Symposium on Modeling, Analysis & Simulation of Computer and Telecommunication Systems; Jul. 25-27, 2011; pp. 248-255 (8 pages) (Year: 2011).
B-tree indexes and CPU caches; Graefe et al; 17th International Conference on Data Engineering; Apr. 2-6, 2011; pp. 349-358 (10 pages) (Year: 2001).
History-aware page replacement algorithm for NAND flash-based consumer electronics; Lin etal.; IEEE Transactions on Consumer Electronics, vol. 62, iss. 1; Feb. 2016; pp. 23-39 (Year: 2016).
A novel hot data identification mechanism for NAND flash memory; Liu et al.; IEEE Transactions on Consumer Electronics, vol. 61, iss. 4; Nov. 2015; pp. 463-469 (Year: 2015).
Hot data identification for flash-based storage systems using multiple bloom filters; Park et al.; 27th Symposium on Mass Storage Systems and Technologies; May 23-27, 2011 (Year: 2011).
BloomFlash: Bloom Filter on Flash-Based Storage; Debnath et al.; 2011 31st International Conference on Distributed Computing Systems; Jun. 20-24, 2011; pp. 635-644 (Year: 2011).
Software Support Inside and Outside Solid-State Devices for High Performance and High Efficiency; Chen etal.; Proceedings of the IEEE, vol. 105, iss. 3; Sep. 2017; pp. 1650-1665 (Year: 2017).
A performance model and file system space allocation scheme for SSDs; Hyun etal.; IEEE 26th Symposium on Mass Storage Systems and Technologies; May 3-7, 2010 (Year: 2010).
Algorithms and data structures for flash memories; Gal et al.; ACM Computing Surveys, vol. 37, iss. 2, pp. 138-163; Jun. 2005 (Year: 2005).
Design and implementation of NAND Flash files system based on the double linked list; Wang et al.; 2011 International Conference on Electrical and Control Engineering; Sep. 16-18, 2011 (Year: 2011).
Hydra: A Block-Mapped Parallel Flash Memory Solid-State Disk Architecture; Seong etal.; IEEE Transactions on Computers, vol. 59, iss. 7, pp. 905-921; Jul. 2010 (Year: 2010).
U.S. Appl. No. 16/434,470, filed Jun. 7, 2019, Wallace, et al.
U.S. Appl. No. 16/440,457, filed Jun. 13, 2019, Shilane, et al.
U.S. Appl. No. 16/511,256, filed Jul. 15, 2019, Wallace, et al.
U.S. Appl. No. 16/511,261, filed Jul. 15, 2019, Wallace, et al.
A DRAM-flash index for native flash file systems; Ho et al.; 2013 International Conference on Hardware/Software Codesign and System Synthesis, pp. 1-10; Sep. 29, 2013-Oct. 4, 2013.
A sequential indexing scheme for flash-based embedded systems; Yin et al.; Proceedings of the 12th International Conference on Extending Database Technology: Advances in Database Technology, pp. 588-599; Mar. 24-26, 2009.
FlashStore: high throughput persistent key-value store; Debnath et al.; Proceedings of the VLDB Endowment, vol. 3, iss. 1-2, pp. 1414-1425; Sep. 2010.
SkimpyStash: RAM space skimpy key-value store on flash-based storage; Debnath et al.; Proceedings of the 2011 ACM SIGMOD International Conference on Management of data, pp. 25-36; Jun. 12-16, 2011.
A multi-level elaborate least frequently/recently used buffer cache for flash storage systems; Noh et al.; Proceedings of the 2009 International Conference on Hybrid Information Technology, pp. 34-41; Aug. 27-29, 2009.
Implementing personal home controllers on smartphones for service-oriented home network; Tokuda et al.; IEEE 8th International Conference on Wireless and Mobile Computing, Networking and Communications, pp. 769-776; Oct. 8-10, 2012 (Year: 2012).
RwHash: Rewritable Hash table for Fast Network Processing with Dynamic Membership Updates; Song et al.: ADM/IEEE Symposium on Architectures for Networking and Communications Systems; May 18-19, 2017.

* cited by examiner

US 10,521,123 B2

ADDITIVE LIBRARY FOR DATA STRUCTURES IN A FLASH MEMORY

CROSS-REFERENCE TO RELATED APPLICATIONS

This application is a Continuation of U.S. patent application Ser. No. 15/196,283 filed Jun. 29, 2016 and issued as U.S. Pat. No. 10,146,438 on Dec. 4, 2018, the disclosure of which is incorporated by reference herein in its entirety.

FIELD OF THE INVENTION

Embodiments of the invention relate to a flash memory and to systems and methods for processing datasets including large datasets and data structures. More particularly, embodiments of the invention relate to a library that support the implementation of data structures in a flash memory and methods for implementing data structures in a flash memory.

BACKGROUND

As the amount of data in computing systems continues to increase, there is a strong desire for improvements that allows the datasets to be efficiently processed. DRAM (Dynamic Random Access Memory) and the like are often too small to efficiently process large data sets. Algorithms that process data out-of-core (using Hard Disk Drives (HDDs)) tend to be slow.

One potential solution is to introduce flash memory into the computing systems. Flash memory is faster than HDDs and has the capacity to accelerate dataset analysis. Even though flash memory can improve the processing capability of computing systems, flash memory has several problems that impact performance.

For example, conventional data structures are designed assuming that random changes or random edits can be performed quickly and without penalty. Flash, memory, however, has a penalty associated with small edits. Small edits in a flash memory require the edited page to be copied forward to a new page. The previous page must be eventually erased before it can be reused. More specifically, data in a used area or page of a flash memory cannot be simply overwritten in a conventional flash memory. Rather, it is necessary to erase the page before writing the data. This is the reason that small edits to a page in the flash memory are simply written as a new page.

This process causes both a performance penalty and a lifespan penalty. This process results in multiple reads and writes (thus the performance penalty). The lifespan penalty occurs because flash memory can only be written or erased a limited number of times before wearing out. Further, flash memory is typically erased in large units.

This creates additional problems when implementing data structures in the flash memory. Every time a change is made to data that is stored in the data structure, there is a potential for multiple writes and erasures. Systems and methods are needed to improve the performance of flash memory and to improve the performance of flash memory and to improve the lifespan of the flash memory.

BRIEF DESCRIPTION OF THE DRAWINGS

In order to describe the manner in which at least some aspects of this disclosure can be obtained, a more particular description will be rendered by reference to specific embodiments thereof which are illustrated in the appended drawings. Understanding that these drawings depict only example embodiments of the invention and are not therefore to be considered to be limiting of its scope, embodiments of the invention will be described and explained with additional specificity and detail through the use of the accompanying drawings, in which.

DETAILED DESCRIPTION OF SOME EXAMPLE EMBODIMENTS

Figure 1:
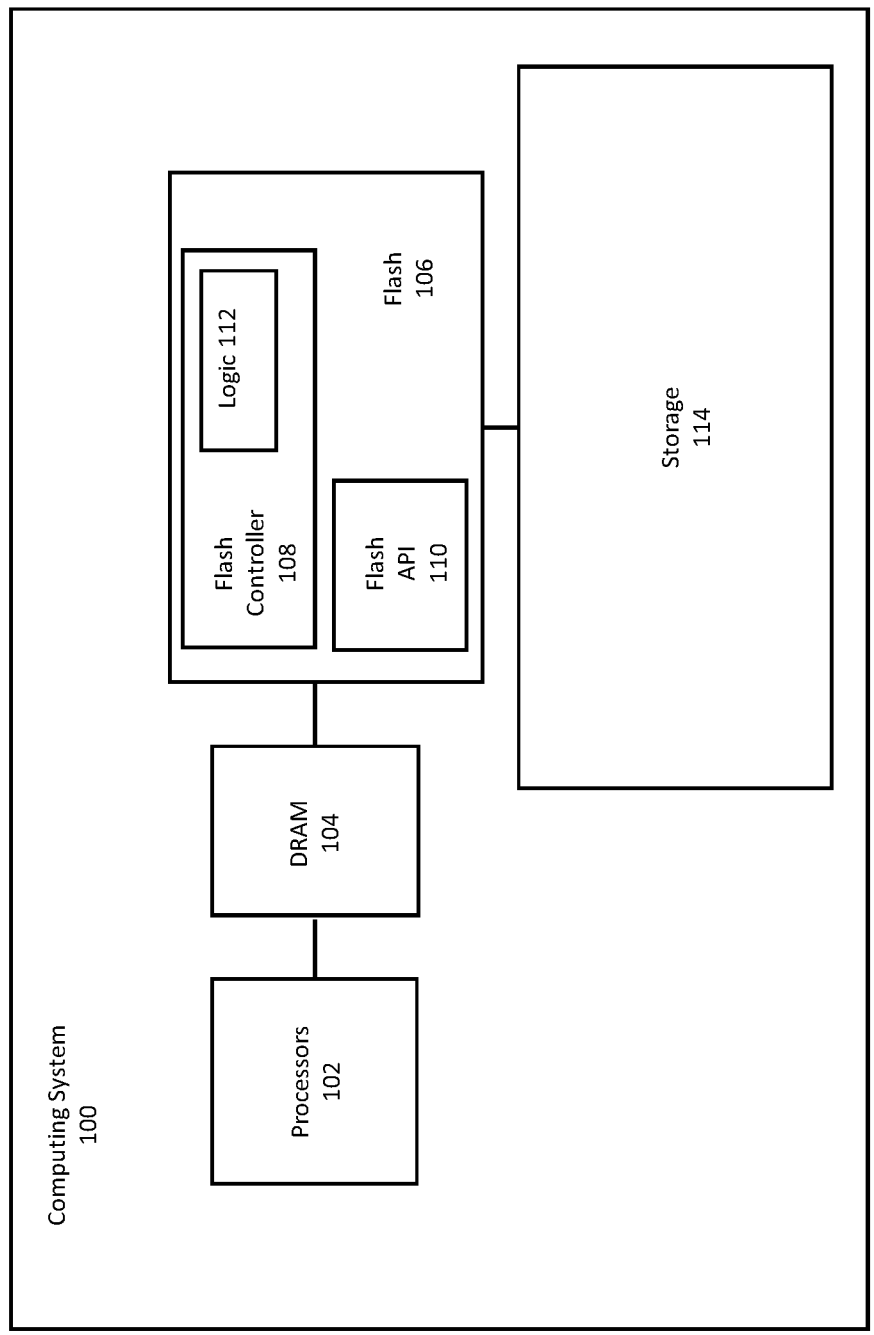
FIG. 1 illustrates an example of a computing system that is configured to perform overwrites in a flash memory.

Embodiments of the invention relate to systems and methods for processing large datasets. Embodiments of the invention further relate to systems and methods for processing large datasets in a flash memory (e.g., SSD (solid state drive)). Embodiments of the invention further relate to systems and methods for controlling or managing flash memory and to interfacing with flash memory. Embodiments of the invention further relate to systems and methods of interacting and/or implanting with data structures in a flash memory.

In a conventional flash memory, the ability to set a bit (i.e., change from a logical 0 to a logical 1) may be supported. However, changing a bit from a logical 1 to a logical 0 (unset the bit) is not supported at the this level (e.g., the bit level). Rather, it is necessary to erase a larger unit in the flash memory. By way of example, flash memory may be erased in 1 megabyte units. As a result, it is not generally possible to overwrite existing data in flash. Instead, new data is written to a new location (which may have been previously erased) and the old location is marked for erasure. Embodiments of the invention enable overwrites of existing data in some instances and in various data structures. Embodiments of the invention allow data structures to be implemented in flash while reducing the number of associated erasures by overwriting some of the data.

A flash memory may include a controller and an interface (e.g., API (application programming interface)) associated with the flash memory controller. In one example, the logic of the flash memory controller is configured to perform writes to existing data (overwriting the existing data) rather than write the data to a new location and mark the old location for deletion. If necessary, the controller may cause the data to be simply written to a new location. For an overwrite operation, the controller may initially read the previous version of the page or block begin written. If the changes being written only result in the setting of more 1s (or changing 0s to 1s), then the existing page or block can be overwritten. If bits need to be unset (changed from 1s to 0s) in the flash memory, then the write may be performed normally to a new page. During this process (read-check-overwrite), the affected page or block may be locked.

In another example, an overwrite can be achieved using calls to a flash memory API. Calls include, by way of example, a logical-OR and a Compare-and-Swap.

During a logical-OR call, a client may provide a block of data and an address. The page (or pages depending on the size of the block of data) at that address is modified to the logical OR of its current contents with the provided block. This only requires setting additional bits. As a result, an overwrite may be performed on the current page or pages without the need to write to a new page or pages. The logical OR changes 0s in the target block that correspond to is in the new data to be set. It may not be necessary to perform an OR operation for each bit in the overwrite operation. It may only be necessary to identify the 0s that need to be changed to 1s.

An overwrite may occur in flash memory by performing a logical OR operation. This operation ensures that 1s located in a target block are unaffected while 0s are potentially changed to 1s. The change occurs when the data being overwritten to the target block contains a 1 where the target block contains a 0. A logical OR operation between bits A and B has the possible outcomes:

| A | B | OR Result |
|---|---|---|
| 0 | 0 | 0 |
| 0 | 1 | 1 |
| 1 | 0 | 1 |
| 1 | 1 | 1 |

A Compare-and-Swap call may be used for locking and thread synchronization when performing overwrites. A client provides the previous version of the block and the new version of the block. More bits are set in the new version. The flash memory, in response to the call, may atomically read the page or block and compare the read page/block with the previous version provided by the client. If the previous version provided by the client matches the page/block read from the flash memory, then the page/block is overwritten with the new version provided by the client in the call using, for example, a logical OR. Other compare-and-swap operations to the same page are blocked until the current call completes.

Embodiments of the invention further implement data structures in the flash memory such that the data structure can be updated using overwrites. This prolongs the life of the flash memory by limiting or reducing the number of erasures and can improve the performance of the flash memory. Examples of data structures include, but are not limited to, Bloom filters, linked lists, hash tables, locking data structures, trees, graphs, and the like or combinations thereof.

FIGS. 1-4 describe a flash memory and examples of logic and calls that may be used to perform an overwrite.

FIG. 1 illustrates an example of a computing system that includes a flash memory and that enables pages to be overwritten from an internal perspective and an external perspective. Overwrites to existing pages (without erasing the data first) can be achieved using internal logic. An external interface, which provides access to an API, allows similar abilities to be invoked by a client. As discussed herein changing a bit from 0 to 1 is setting a bit and changing a bit from 1 to 0 is unsetting a bit. Unsetting bits can typically only be performed by erasing an erasure unit at a time and an erasure unit may include multiple pages.

FIG. 1 illustrates a computing system 100 that includes processors 102, DRAM 104, flash memory 106, and storage 114. The computing system 100 may be configured to provide computing services such as backup services, document management, contact management, or the like. The computing system 100 can be formed of network connected devices or may be implemented as an integrated unit. The computing system 100 can be connected to a computing network.

The storage 114 may include various hardware storage devices (e.g., magnetic, optical, etc.) such as HDDs. The storage 114 can be arranged in different manners. The DRAM 104 and the flash 106 can be used as caches in the computing system 100. The DRAM, which is the fastest memory, is typically smaller than the flash memory 106. The flash memory 106 is typically smaller than the storage 114. In other embodiments, the flash 106 may be the primary storage and the storage 114 could be omitted. The flash memory 106 can be large (e.g., terabytes or larger). The computing system 100 may be configured for processing large data sets such as backup data, data lake data, or the like.

The flash memory 106 is associated with a flash controller 108 and a flash API 110. The flash controller 108 typically controls operations occurring within the flash 106 and may include its own processor and memory. The flash API 110 allows clients to make specific calls to the flash memory 106, which may be executed by the flash controller 108. The client may be any device or component (e.g., processor, memory controller, process) that interacts with the flash memory 106.

The flash controller 108 is associated with logic 112 that may be configured to interact with the data stored in the flash memory 106. The logic 112, for example, may perform overwrites, logical-ORs, compare-and-swaps, or the like.

Figure 2:
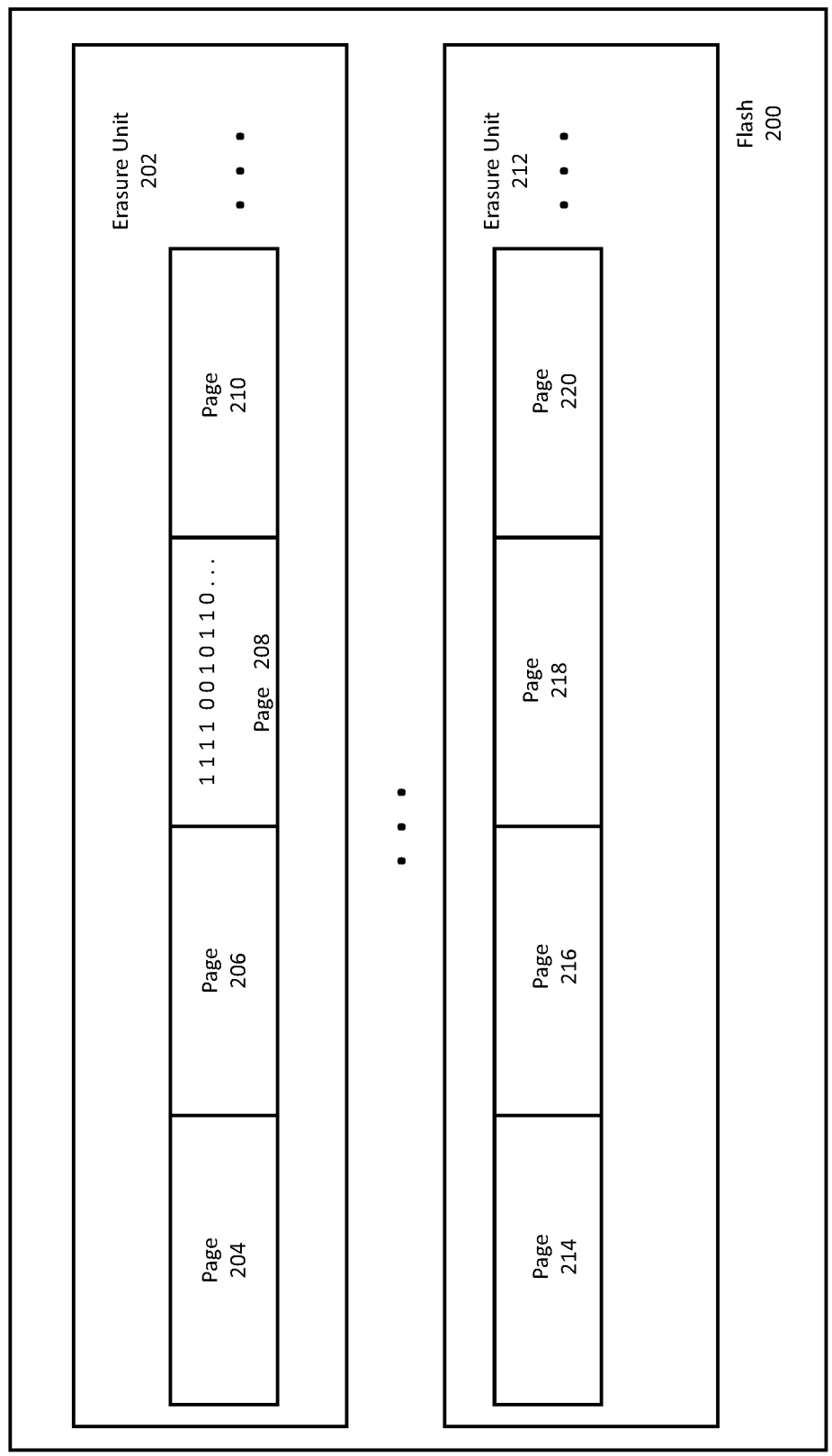
FIG. 2 illustrates an example of a flash memory that is configured to perform overwrites.

FIG. 2 illustrates an example of a flash memory and illustrates how data may be arranged in the flash memory. FIG. 2 illustrates a flash memory 200, which is an example of the flash memory 106 shown in FIG. 1. The flash memory 200 includes erasure units, such as erasure units 202 and 212. Each erasure unit is associated with pages. Pages 204, 206, 208, and 210 are associated with the erasure unit 202 and the pages 214, 216, 218, and 220 are associated with the erasure unit 212. One of skill in the art can appreciate that the flash memory is typically much larger than illustrated.

The pages 204, 206, 208, and 210 are smaller than the erasure unit 202. By way of example only, the pages 204, 206, 208, and 210 may be 4 KB each. The erasure units 202 and 212 may be 1 MB each. Data stored in the flash memory 200 may also be arranged in containers or using other storage arrangements. However, when data is written to the flash memory 200, the data is written in pages and the pages are usually written in sequence.

In order to write a new page in a conventional flash, it is necessary to erase all pages in the erasure unit first before writing the pages in the newly erased erasure unit or write the new page to a new location. For example, the page 208 includes data. Because the page 208 contains data, a conventional flash cannot simply write new data to the page 208. Rather, it is necessary to erase all pages 204, 206, 208, and 210 in the erasure unit 202 before new data can be written to the page 212. In fact, all pages in the erasure unit 202 would be erased because erasures are performed at the level of the erasure unit 202. The new data could alternatively be written to a new location and the existing page or erasure unit marked for erasure.

Embodiments of the invention, in contrast, allow data to be written to the page 208 by performing an overwrite operation. In particular, embodiments of the invention allow data to be written to the page 208 or any other page in the erasure unit 202 as long as the write makes no changes so specific cells (or bits) become unset, but only changes 0 bits to 1 s. This is because the flash memory 200 may allow more electrons to be stored in an individual cell (representing one bit) thus semantically changing the value from 0 to 1. Reducing the electrons to change a 1 to a 0, however, involves erasing an entire erasure unit due to the hardware constraints. Thus, data such as 0000 can be overwritten as 0101 because only 0s are being changed to 1s. An overwrite is not permitted when attempting to change 1110 to 0010 because this involves changing is to 0s for this type of flash memory. In this case when changing is to 0s, it may be necessary to follow conventional flash memory writing procedures, which may involve writing the data to a new page and erasing the pages in the erasure unit.

Figure 3:
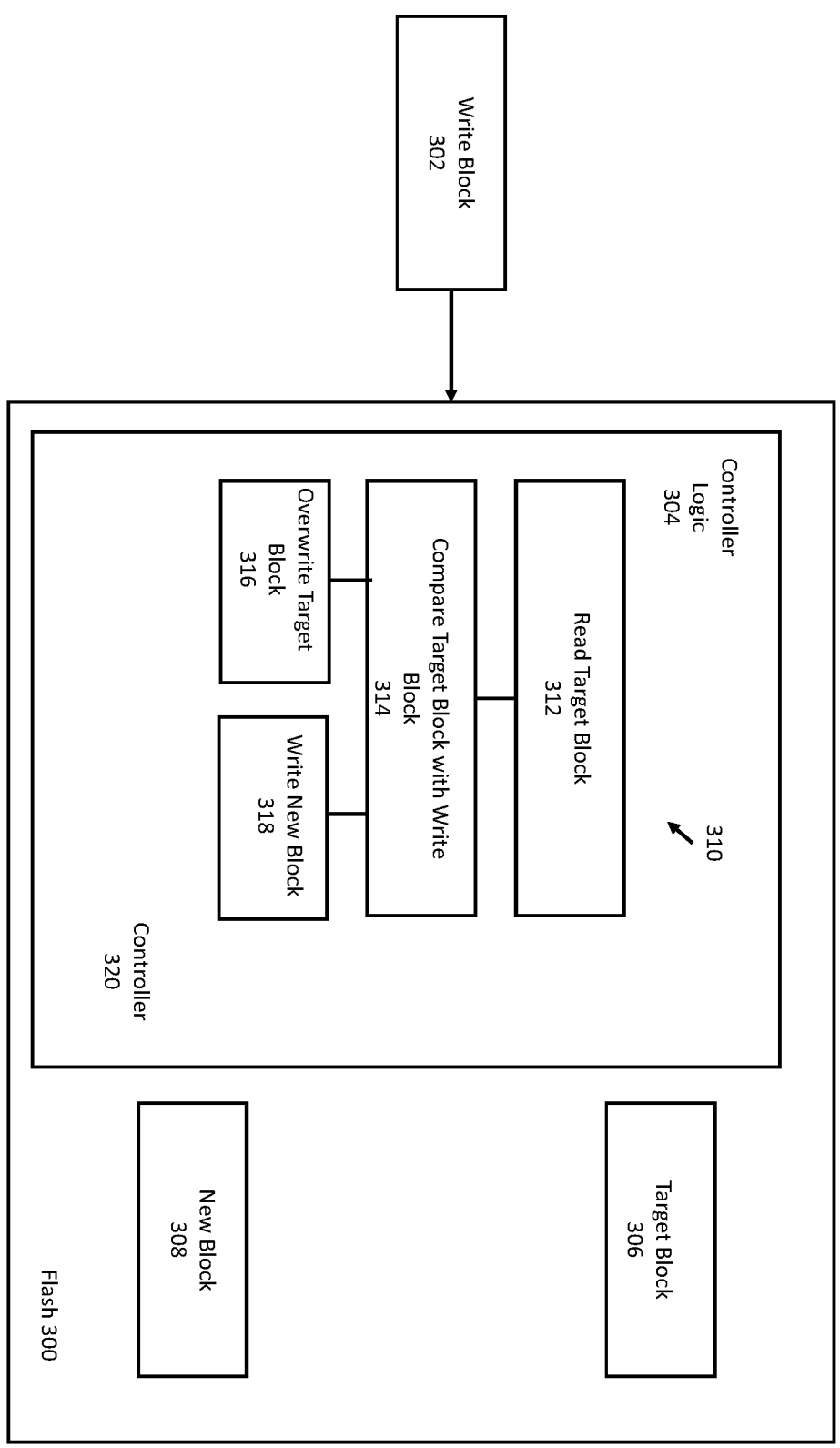
FIG. 3 illustrates an example of internal logic for overwriting portions of a flash memory.

FIG. 3 illustrates an example of a flash memory that includes a controller and illustrates an example of logic associated with performing an overwrite in the flash memory. FIG. 3 illustrates that the flash memory 300 may receive a write block 302 from a client (e.g., a thread, process, or the like). When the write block 302 is received, the controller may perform controller logic 304 to perform the write operation in the flash memory 300.

The write operation may include performing a method 310. The write block 302 may write to more than one page in the flash memory 300. In box 312, the controller 320 may read the target block 306. The target block 306 may be, by way of example, a previous version of the write block 302. The target block 306 may be located at a destination address included in the write request received along with the write block 302.

After reading the target block 306, the controller 320 may compare the target block 306 with the write block 302. The result of the comparison determines, in one example, whether the target block 306 can be overwritten with the write block 302 or whether the write block is written to a new location as the new block 308. The comparison may identify which bits need to be changed from 0s to 1s.

In one example, if the comparison in box 314 determines that writing the write block 302 to the target block 306 would only set bits from 0s to 1s, then the target block 306 is overwritten with the write block 302 in box 316. If the comparison determines that it is necessary to reset is to 0s, then the write block 302 is written to a new location as the new block 308 in box 318. The target block 306 may be marked for deletion or erasure.

The logic performed in the method 310 is internal to the flash memory 300 in this example. The client associated with the write operation may not be aware of the overwrite method performed in the flash memory 300.

During the method 310 and in particular while reading the target block, comparing the target block with the write block and overwriting the target block, the page or pages associated with the target block are locked at 320 so that another client does not interfere with the method 310. A lock may be used during the overwrite method 310. The controller 320 may set aside some memory to track which regions of the flash memory 300 are locked.

Figure 4:
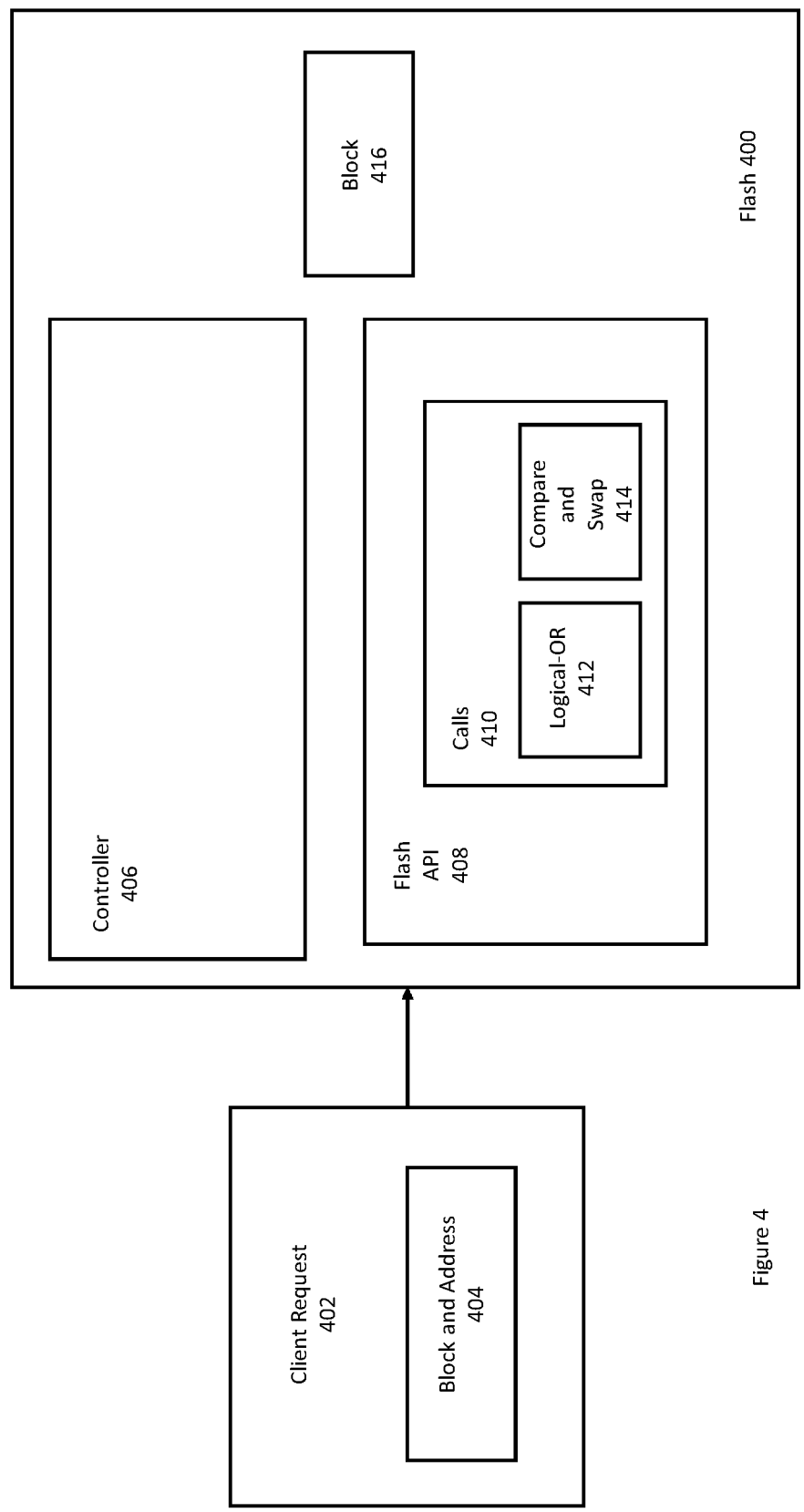
FIG. 4 illustrates an example of an external interface for overwriting portions of a flash memory and for locking portions of the flash memory when performing overwrites.

FIG. 4 illustrates an example of an external interface for overwrites in a flash memory. FIG. 4 illustrates a flash memory 400, which is an example of the flash memory 106 in FIG. 1. The flash memory 400 includes a controller 406 and an API 408. The API 408 includes calls 410 including, by way of example, a logical-OR 412 and a Compare and Swap 414.

In contrast to the internal logic illustrated in FIG. 3, the API allows a client to explicitly call the API 408. The logical-OR call 412 allows a client 402 to provide a block of data and an address 404. A logical OR is performed between the page or pages at the address provided in the client request 402 with the block 416 at the specified address. This call compares or performs a logical OR with each respective bit. A logical OR has the property that it never changes a one to a zero, but zeros may be changed to one if they are ORed with a one. This operation is an overwrite that potentially replaces 0s in the block 416 to 1s. The client may be aware, prior to making the call, that the necessary updates to the block 416 can be achieved with the logical OR operation. An OR operation may not be required for each bit. Rather, the logical OR effectively changes 0s in to the block 416 to is based on the contents of the block provided in the client request 402. Thus, the logical OR may simply identify the bits to be changed to 1 s and make those changes. If the hardware is configures such that an entire page is written at a time, then the page is written such that the relevant 0s are changed to 1s.

The compare and swap call 414 can be used for locking and for thread synchronization when performing overwrites. When making a compare and swap call 414, the client may provide a previous version of a block and a new version of the block. The new version may have new bits set. The controller 406 may then compare the previous version included in the request with the block 416 to insure that another client has not changed the block. If the comparison is equal, the block 416 can be overwritten (e.g., by using logical-OR operation) with the new version included in the client request 402. Other callers attempting to impact or alter block 416 will be blocked until these compare and swap operation completes. Thus, the controller 406 may also lock locations in the flash memory 400 that are being updated or changed in accordance with the controller logic or API calls 410.

The calls and logic discussed herein may be implemented with computer executable instructions and the controller 406 and/or the flash memory 400 are examples of a computing device. The calls and logic discussed herein may also be used when interacting (e.g., read/write/update) with data structures implemented in a flash memory.

Figure 5:
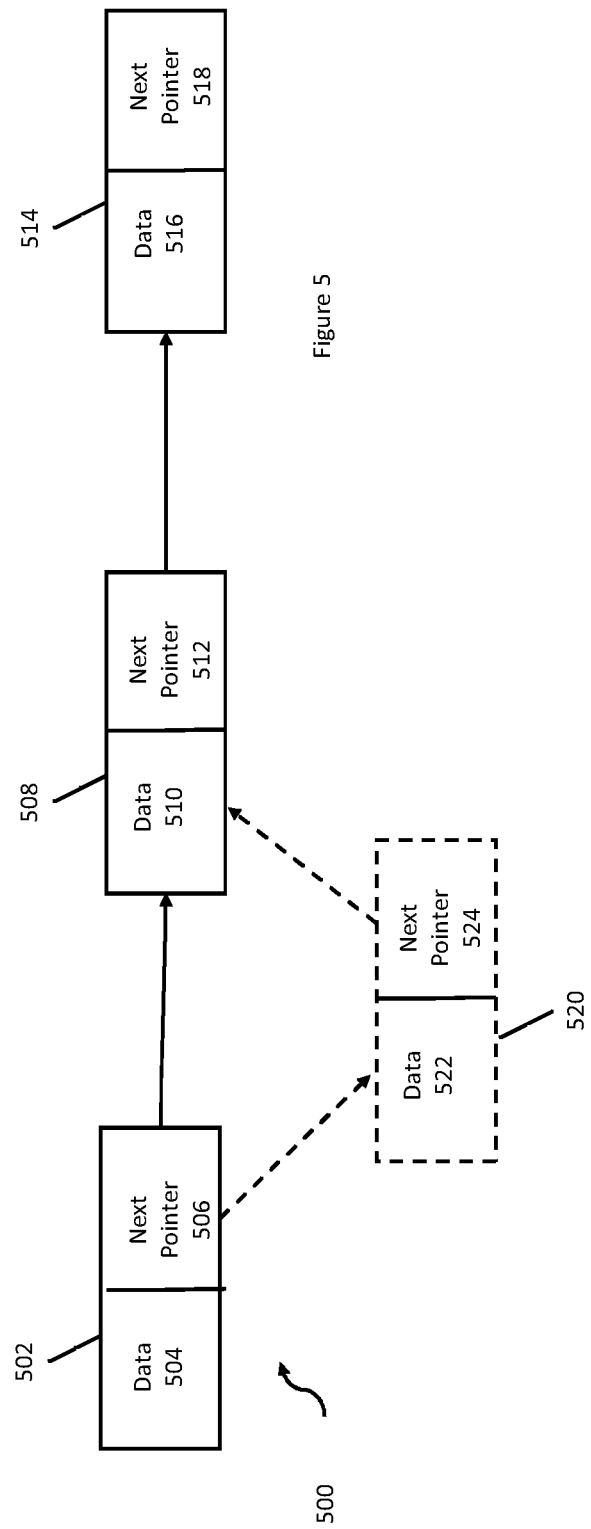
FIG. 5 illustrates an example of a linked list that can be implemented in a flash memory.

FIGS. 5-8 illustrate examples of a data structure that may be implemented in a flash memory. FIG. 5 illustrates an example of a linked list that may be implemented in a flash memory. FIG. 5 illustrates a linked list 500 that includes nodes 502, 508 and 514. In one example, the data and/or the next pointer of the nodes 502, 508 and 514 may be written by overwriting the nodes or pages of the nodes as necessary.

The node 502 includes data 504 and a next pointer 506. The node 502 is the head or first node of the linked list 500 in this example. The next pointer 506 points to the node 508, which includes data 510 and a next pointer 512. The next pointer 512 points to the node 514, which includes data 516 and a next pointer 516. If the node 514 is the last node of the list, the next pointer 516 may be set to a value indicating that it is the last node or that there is no other nodes. For example, the next pointer 516 may be NULL or may be initially set to all zeros. By setting the next pointer 516 to all zeros, adding a node at the end of the linked list is easily achieved because the next pointer 516 can easily be overwritten with the next pointer to the newly added node. Thus, the next pointer 516 to be overwritten when adding a node to the end of the linked list such that the next pointer 516 can point to the new node.

However, a node can be inserted at any point of the linked list 500. When inserting a node 520 between nodes 502 and 508, for example, the next pointer 506 points to the data 522 of the new node 520 and the next pointer 524 of the new node 520 points to the data 510 of the node 508. If possible, the next pointer 506 is overwritten. If the next pointer 506 cannot be overwritten because some of the bits need to be unset, another procedure may be followed such as discussed below with reference to FIGS. 6-8. After the node 520 is inserted, the direct link between the node 502 and 508 is no longer present in the linked list 500. A node can also be inserted at the beginning of the linked list. With the present disclosure, one of skill in the art can appreciate that the following discussion can be applied to doubly linked lists where each node includes pointers that point to the previous node and the next node. Embodiments adapt the linked list 500 so that the linked list can be implemented efficiently in a flash memory.

Figure 6:
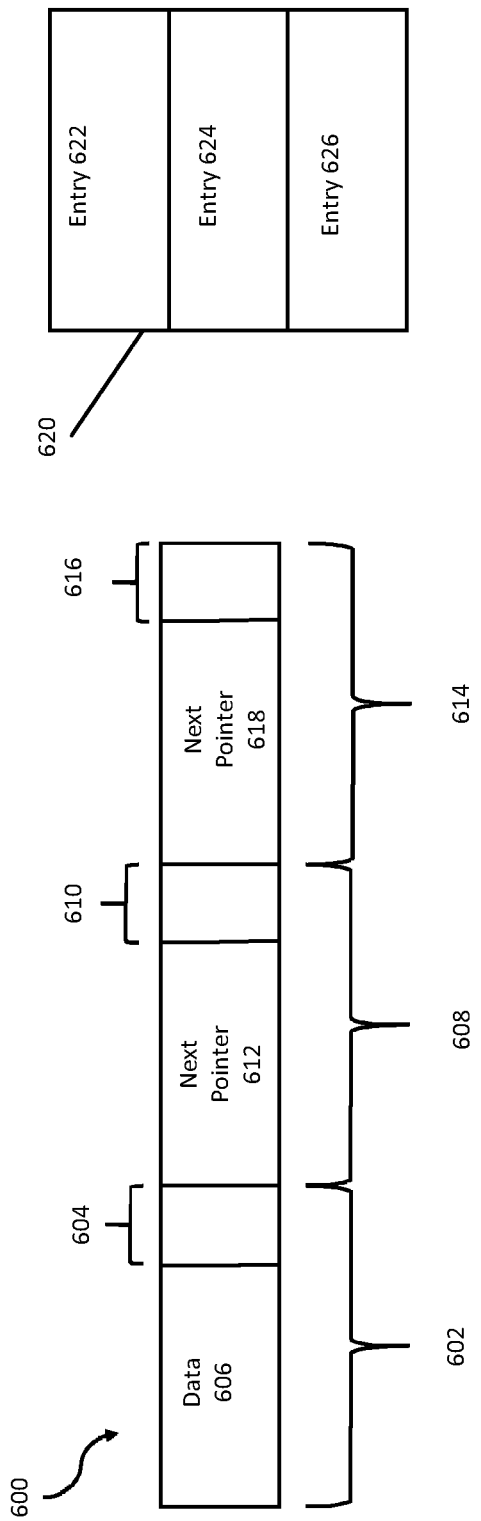
FIG. 6 illustrates another example of a node of a linked list in a flash memory.

FIG. 6 illustrates a more detailed example of a node 600 in a linked list. The node 600 includes a data portion 602 and a pointer portion 608. The node 600 may optionally include additional pointer portions such as the pointer portion 614. The node 600 or the linked list may also be associated with an in memory (e.g., in DRAM) table 620 (e.g., a hash table). The entries 622, 624, and 626 (the table 620 may have multiple entries) are used to store pointers. More specifically, the table 620 can be used to store next pointers of various nodes when the next pointers cannot be overwritten. At various times, the table 620 can be written to the cache and the linked list or portions thereof may be rewritten. This may involve writing at least some of the nodes to new locations in the flash memory.

The data portion 602 may include data 606 and an invalid bit 604. The pointer portion 608 may include a next pointer 612 and an invalid bit 610. The pointer portion 614 may include a next pointer 618 and an invalid bit 616. Embodiments of the invention may include less than the elements illustrated in FIG. 6. For example, a node may not include the invalid bit 604 or the second pointer portion 614. Further, some of the pointer portions may not include an invalid bit. The node 600 or portions thereof is an example of the nodes 502, 508, and 514.

Conventionally, updating the pointers included in the nodes of linked lists is an expensive operation in flash memory because each operation may trigger a new page write or writes and an erasure operation. Embodiments of the invention can reduce the new page writes and the erasures. Embodiments of the invention allow linked lists to be implemented by making updates via an overwrite process when possible.

Initially, the invalid bits 604, 610 and 616 have a value equivalent to a logical 0. When it is necessary to change the next pointer 612 (e.g., when a new node is inserted into the linked list), the invalid bit 610 can be set to indicate that the next pointer 612 is no longer valid.

The pointer portion 614 is then used to store the new next pointer. Because the next pointer 618 is initially set to all zeros, the next pointer 618 can be used as the next pointer of the node 600 by overwriting the next pointer 618 with the new next pointer. This can be done using a logical OR because the contents of the next pointer 618 are initially all zeros. When the node 600 is traversed, the invalid bit 610 will cause the next pointer 618 to be used as long as the invalid bit 616 is not set. If another update is necessary to the node 600, the invalid bit 616 can be set and the new next pointer could be stored in the entry 622, which would be associated with the node 600. During a traversal when the invalid bits 610 and 616 are both set, the next pointer will be obtained from the entry 622.

Figure 7:
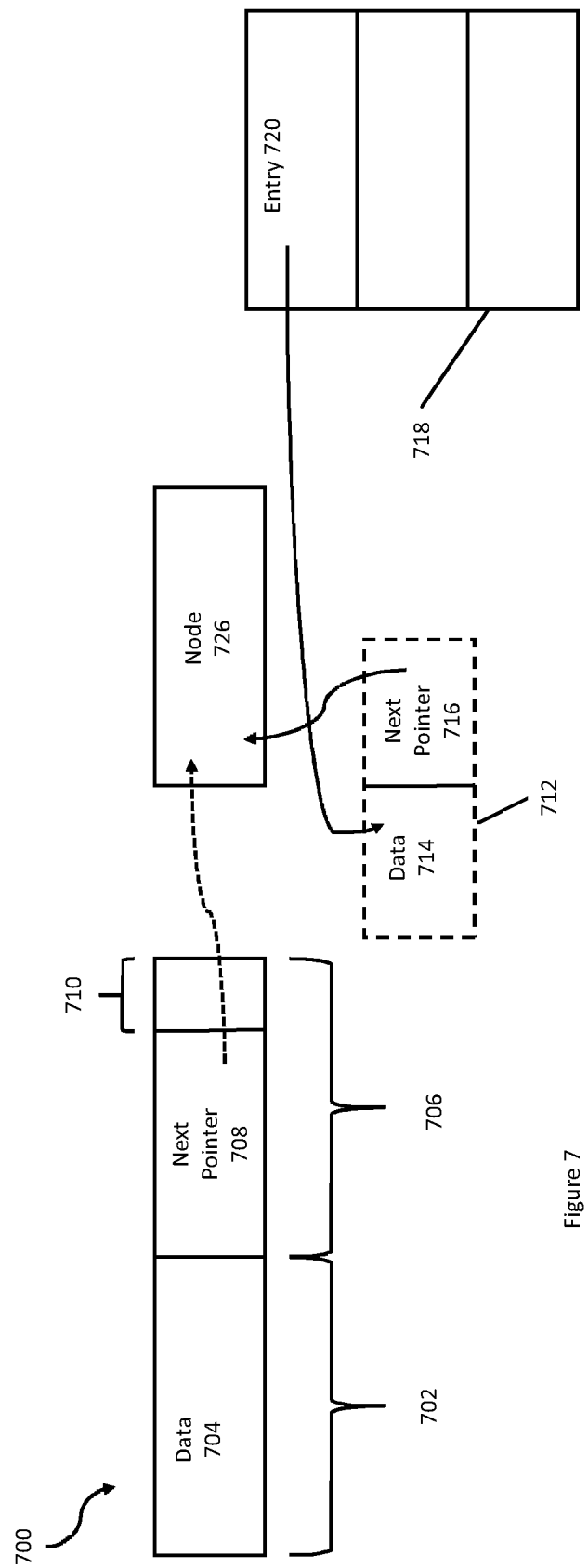
FIG. 7 illustrates another example of a node of a linked list in a flash memory.

FIG. 7 illustrates an example of a node of a linked list. The node 700 includes a data portion 702 storing data 704 and a pointer portion 706 that includes a next pointer 708 and 710. Initially, the next pointer 708 points to the node 726 or to the data of the node 726. When a node 712 is inserted into the linked list, embodiments of the invention can insert the node 712 without having to write the node 700 to a new location. More specifically, the invalid bit 710 is set to 1. This indicates that the contents of the next pointer 708 are no longer valid. The new next pointer of the node 700 is inserted in the entry 720 of the table 718, which is in memory. The entry 720 thus points to the data 714 of the node 712 and the next pointer 716 points to the node 726. Thus, when traversing the linked list and the invalid bit 710 is set, the table 718 is checked to determine the next position or node in the linked list that follows the node 700. This may not be necessary when the node is added to the end of the linked list because the next pointer of the last node can always be overwritten because it is initially set to zeros. Additionally this may not be necessary when the next pointer 708 only requires more bits to be set from 0 to 1 to become a next pointer referencing data 714. In such a case the next pointer 708 can be overwritten with Logical-OR to become the next pointer pointing to data 714.

As nodes are added to the linked list, the table 718 may become full of pointers. The linked list may then be written by writing the updates or entries in the table 718 to the flash memory. This may require at least portions of the linked list to be written to new locations in the flash memory. In one example, the entire linked list may be written to a new location in the flash memory and the old linked list may be marked for erasure. Table 718 may be implemented in many ways including as a hash table, tree, or array. The key to the table may be multiple possible values including the address of nodes (such as the flash location of node 700) or an identifier associated with data 704. The table efficiently maps from such a key to a next pointer for updated nodes.

Figure 8:
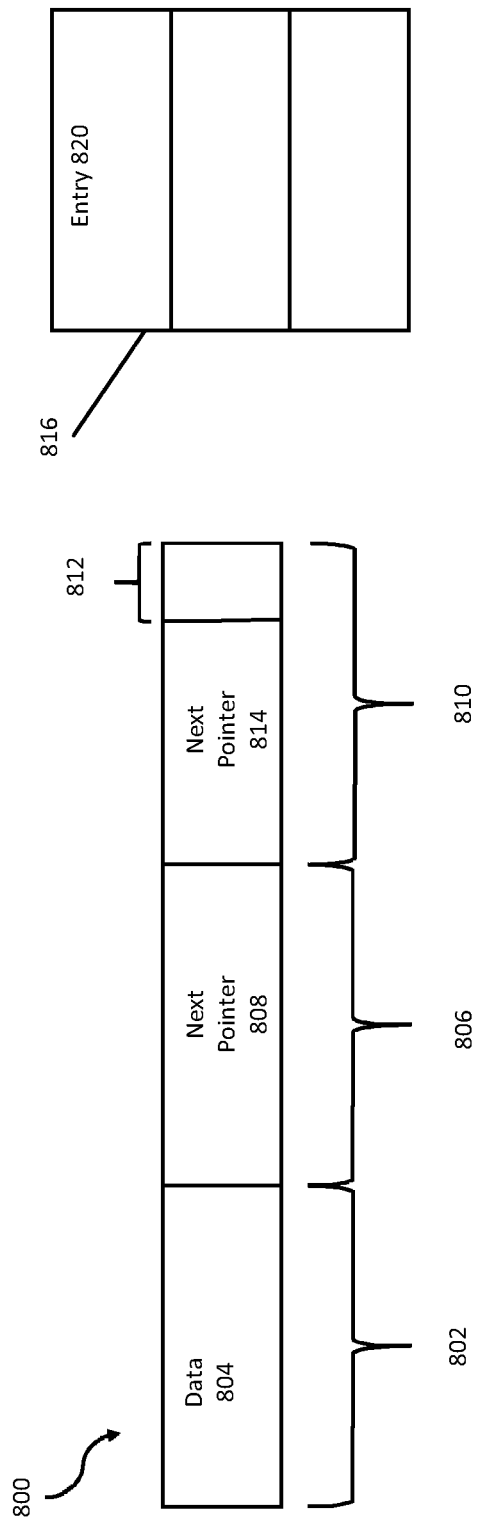
FIG. 8 illustrates another example of a node of a linked list in a flash memory.

FIG. 8 illustrates another example of a node that includes multiple next pointers. The node 800 includes a pointer portion 806 and a pointer portion 810. In this example, the pointer portion 810 includes a next pointer 814 and an invalid bit 812. Alternatively, none of the pointer portions 806 and 810 include an invalid bit. When inserting a node, all bits of the next pointer 808 may be set to 1s. This is another way of indicating that the next pointer 808 is invalid. The next pointer 814, which is initially set to all zeros, is set to a value that points to the inserted node.

If the invalid bit 812 is set or if the next pointer 814 is set to all 1s, or another predefined invalid value, when the next bit 812 is not present, then the new next pointer associated with the node 800 may be placed in the entry 820 of the table. In some embodiments more or fewer than 2 next pointers may be included with each node in the linked list.

These examples demonstrate that the traversal of a linked list and the insertion of a node may depend on the configuration of the nodes. If a node is configured with multiple pointer portions, then these pointers can be evaluated in sequence until a valid pointer is found (which may be in an entry in a table). Thus, if there is sufficient space in the flash memory, a node may include multiple next pointers. To update the pointer, the current pointer is set to all 1s (or the invalid bit is set) and the new pointer is inserted in the next pointer portion of the node. If necessary and if all available pointer portions are used, the new pointer may be stored in the in memory table 816. The pointers in memory can be written to flash and the linked list revised accordingly at various times.

With reference back to FIG. 6, the data portion 602 may also include an invalid bit 604. When the invalid data bit is set, the data is skipped and the traversal proceeds to the next node in the linked list in accordance with the next pointer associated with the node.

In another example, a pointer in a node or a data portion can be marked invalid by setting all the bits to is or by setting the bits to a value indicating that the pointer or data is invalid. This may include setting a certain portion to is. In one example, the value may be selected so that marking the pointer or data as invalid can be accomplished via an overwrite operation.

Many of the operations associated with linked list and described herein are accomplished by overwriting. Invalid bits, for example, can be performed using an overwrite operation. A next pointer can be set to all ones using an overwrite operation. When possible, the affected portions of a node are overwritten when possible. Writes to new locations are performed when unsets are required.

A node can be removed from the linked list by setting the invalid data bit in the node. This allows the linked list to be traversed while skipping the data of the effectively removed node. Alternatively, the next pointer of the previous node can be modified to point to the node that follows the node being removed. The removed node can be marked for erasure.

The foregoing discussion illustrates that a data structure such as a linked list implemented in flash memory can be managed or implemented using overwrites to effect writes rather than writing to a new location. In some instances, portions of the nodes or other elements of the data structures can be overwritten as long as the overwrite only changes 0s to 1s. As previously discussed, 1s cannot be changed to 0s in the flash memory unless a larger erasure unit is erased. Any changes requiring an unset (changing a 1 to a 0) may result in a write to a new location in the flash cache so that the old area can be erased. Embodiments of the invention further associate a table in memory with the data structure. The table is configured to store or buffer certain writes. For example, writes that cannot be performed via an overwrite may be stored in the table. By storing writes in a buffer or table, the need to rewrite the affected data can be delayed and batched, the number of writes to new locations and the number of erasures can be reduced.

Figure 9:
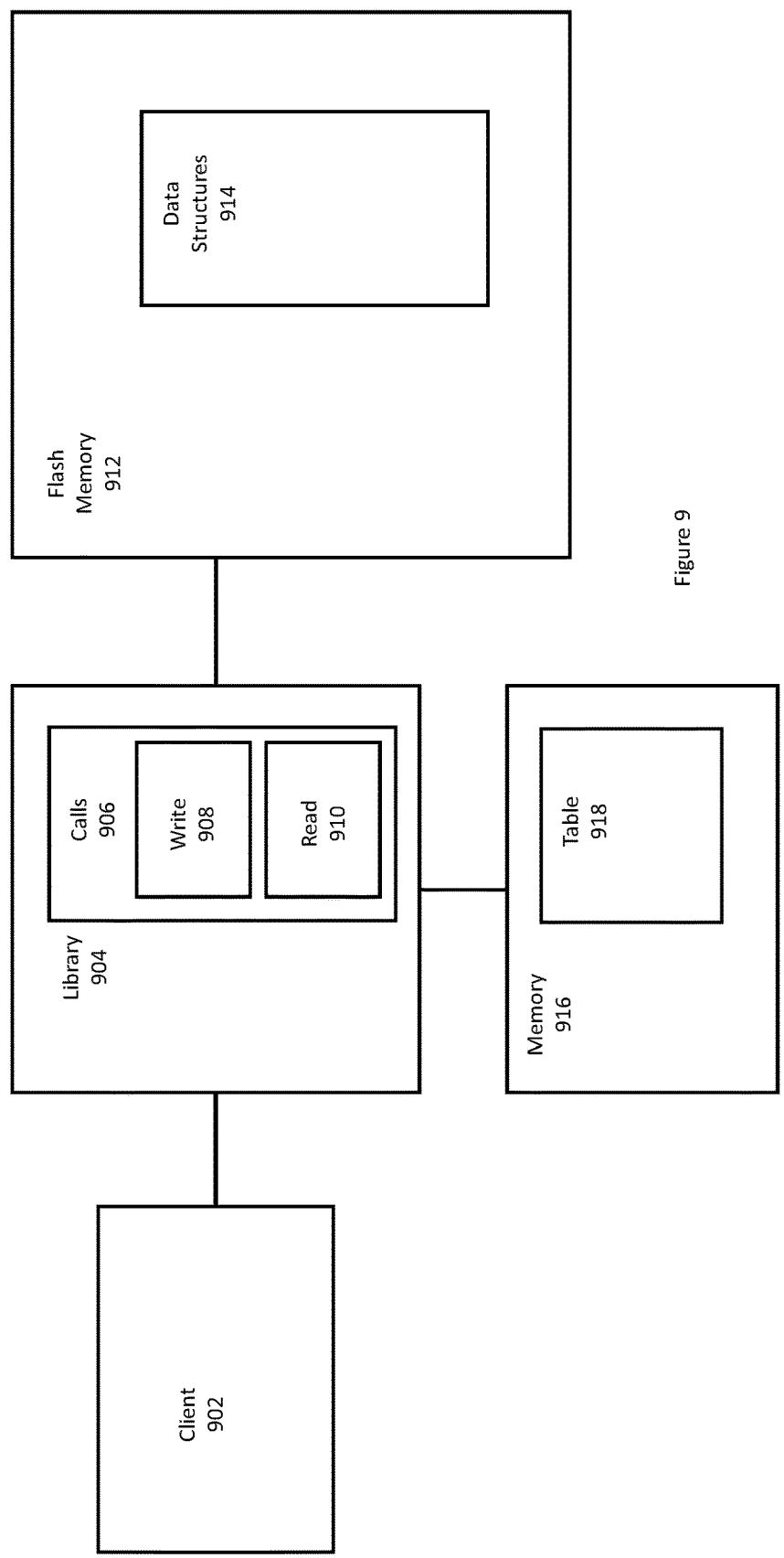
FIG. 9 illustrates an example of a library that supports data structures implemented in a flash memory.

FIG. 9 illustrates an example of a library configured to interact with and manage data structures implemented in flash memory. FIG. 9 illustrates a library 904 that allows a client 902 to interact with data structures 914 without regard to the flash memory 912 and without requiring the client 902 to know that the data structures 914 are implemented in the flash memory 912. In other words, the client 902 may not be required to specify between an overwrite and writing to a new location when writing to the data structures 914. The library 904 provides calls 906. The calls 906 include a write call 908 and a read call 910. The library 904 may be implemented as a software library that can be accessed by a program or process or thread such as the client 902.

The library 904 allows a client that is reading from or writing to a data structure in flash memory to simply specify a write or a read. The read request or call is accompanied by a location, which may simply identify the data structure and an offset. The write request or call may be accompanied by the location and the data to be written to the location in the data structure.

The library 904 may cooperate with the flash memory 912 to implement the write request as an overwrite or as a conventional write. More specifically, the library 904 can implement the write by performing an overwrite when possible or call logic implemented in the flash memory to perform the overwrite when possible.

The data structures 914 may each be associated with a table 918 in memory (e.g., a hash table). During the write process, the data to be written may be temporarily stored in the table. When portions of the data structure are stored in the table 918, a read operation performed in response to a read call 910 may read the data structure and update the data with information from the table 918 in memory prior to returning a result of the read to the client 902.

When a write request is issued by the client 902, the write call 908 may convert the write request into an overwrite. The client 902 is shielded from the manner in which the write request is implemented in the flash memory 912. For example, the write request from the client 902 may include data to be added to the data structure. The data may be a change to a node of a linked list, an entry in a Bloom filter, a node in a tree or graph, or the like and may be implemented by overwriting existing data.

For example, the write call 908 may allow a write to any offset in the data structure. The write request received by the write call 908 does not need to be page aligned with respect to the organization of the flash memory 912. The write request may also include the bytes to be written (size) and the offset. The library 904 receives the write request and may determine the page in the flash memory that corresponds to the offset identified in the write request.

The library 904 will read the data from the data structure 914 at the location corresponding to the write request and determine whether the write or update can be performed by an additive write, for example by performing a logical OR where only 0s need to be changed to 1s. If this is the case, the target data of the write request can be overwritten with the update.

If an overwrite cannot be performed, the library 904 may perform a different response. In one example, the library 904 may read the page, add the bytes included in the write request to the read page and then write the updated page to a new location in memory. In another example, the new data or update may be stored in the table 918 (e.g., a hash memory). When the new data associated with the write request is stored in the table 918 in the memory 916, the entry is associated with the location of the data in the data structures 914. The entry in the table 918 may also store the offset or page and offset for the write data. In this example, changes that could not be committed to the data structures 914 in the flash memory 912 by an overwrite operation may be accumulated in the table 918. When enough changes have accumulated in the table 918 in memory, the changes can all be written to a new page at the same time. This may be performed by reading the page from the data structure, applying the updates to the page and writing the updated page to a new location in the flash memory 912.

For example, when the data structure 914 is a linked list and a node is inserted such that the next pointer of the previous node cannot be overwritten, the new next pointer can be maintained in memory in the table 918. In fact, if the new next pointer is changed again, the new next pointer in the table 918 can be replaced in memory with another next pointer. This allows changes to accumulate in the table 918 without having to write a new page in the flash memory 912 for every change to the linked list. If the data of a node in the linked list is changed such that the update cannot be implemented by an overwrite operation, the change may be stored in the table 918. Subsequent changes may overwrite the change in the table 918 or be added as additional entries in the table 918. All of these changes can be applied when the node is rewritten to a new page or when the node is read.

A read request from the client 902 may require the library to access both the data structures 914 and the table 918. For example, the library 904 may need to check the table 918 to determine whether updates or changes to the data being requested have been stored in the table 918 in memory 916 when performing a read operation for the client 902. In other words, the library 904 may reassemble the data in response to the read request. When a page is 4 KB, for example, a read operation may access the page. The table 918 is then examined to determine if any bytes in the page have been updated. If so, the bytes in the retrieved page are updated with the data from the table 918 and the reconstituted or updated page is returned to the client 902.

Changes to a data structure such as a linked list as described previously can be achieved using the library 904. The library 904 can translate a write request or a read request to identify the appropriate location in the flash memory. Further, the write request may be converted into an overwrite operation when an overwrite operation is possible. The library 904 may also implement a table 918 (e.g., a buffer) that allows writes to accumulate before being written to new pages. At the same time, the buffer can be used to update any data from the data structure 914 that is returned in response to a read request.

Embodiments of the invention may be performed on many different data structures that are implemented such that at least some updates can be made via an overwrite operation or compare and swap operation or as otherwise disclosed herein. Example data structures include, but are not limited to, linked lists, Bloom filters, locking structures, trees, graphs, and the like.

Figure 10:
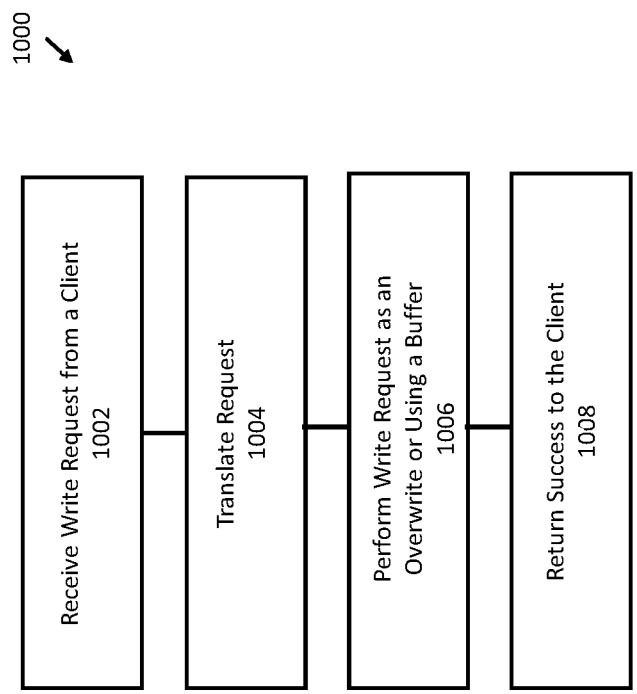
FIG. 10 illustrates a method for performing a write request from a client to a data structure in a flash memory.

FIG. 10 illustrates an example of a method for performing a write to a data structure in a flash memory. The method 1000 may begin in box 1002 by receiving a write request from a client. The write request may include data to be written to the data structure. The write request may also include or identify a location. For example, the write request may identify an offset into the data structure and a size of the data.

In box 1004, the write request is translated. More specifically, the container or page in the flash memory corresponding to the write request is determined from the offset. Because a flash memory may write only in certain increments (e.g., 4 KB), writing a smaller amount of data may still result in a new page.

In box 1006, the library determines whether or not the write request can be performed as an overwrite operation. If the data provided in the write request only changes 0s in the identified page (or pages depending on the size of the data) to 1s, then the target data of the write request may be overwritten with the data included in the write request into the flash memory. There is no need to write the page to a new location and no need to delete the old page when an overwrite is performed.

In box 1006, if the library determines that writing the data would require unsetting a bit, then the data may be written to an in-memory buffer and associated with the appropriate location in the page. The entry in the buffer may identify a page and an offset for the data in the write request for example. In box 1008, a success is returned to the client.

In addition, multiple write requests may be received from one or more clients. Each of the write requests is translated to identify the page and bytes or bits within the page to be written and a determination is made as to whether an overwrite can be performed. As multiple write requests are being performed, some of the write requests may result in overwrites to appropriate pages. Other write requests may result in buffer entries. The pages may be locked as necessary. Further, changes stored in the buffer or table may be time indexed so they can be applied in order.

At some point, the buffer may be flushed to the flash memory. Writing the data in the table or buffer may require multiple pages of the data structure to be written to new locations and old pages to be marked for erasure. The buffer may be flushed when one of several conditions is met including: the buffer's fullness has reached a threshold value, sufficient time has passed since the last buffer flush to flash, a scheduled time is configured to flush from buffer to flash.

Figure 11:
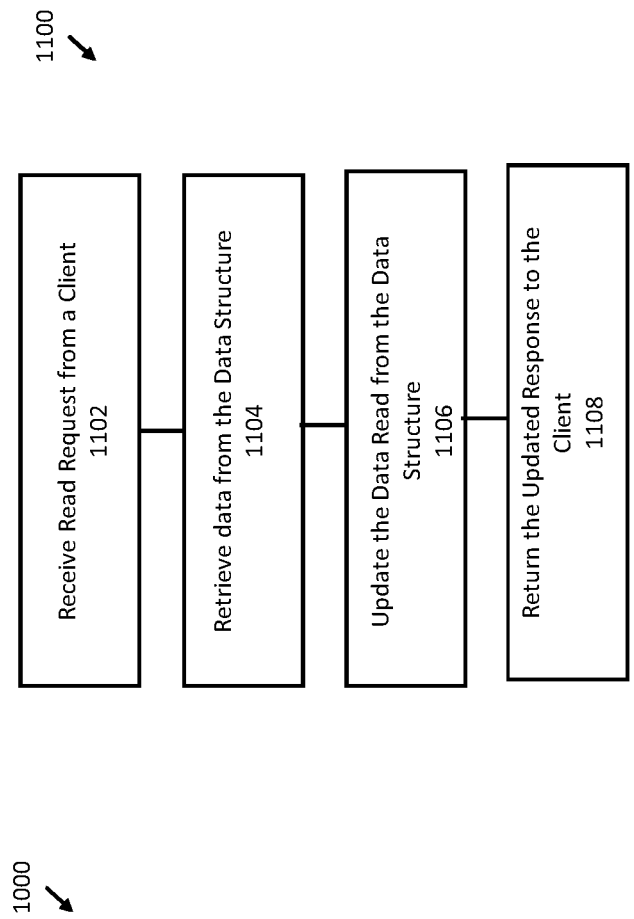
FIG. 11 illustrates a method for performing a read request from a client for data from a data structure in the flash memory.

FIG. 11 illustrates an example of a method for reading data from a data structure. The method 1100 may begin by receiving a read request from a client in box 1102. Multiple read requests may be received from one or more clients. The read request do not need to be page aligned and do not need to specify a page of data.

The read request may include an offset into the data structure and the offset is translated to identify the page in the data structure corresponding to the read request. Once translated, the data (e.g., the page, portion of the page, or other block) is retrieved from the data structure in box 1104.

In box 1106, the data retrieved from the data structure is updated, if necessary, from entries in the in-memory table. For example, because data may be associated with multiple updates, these updates may be applied, in order in one example, to the data retrieved from the data structure. Once the data is updated, returned to the client in box 1108.

The embodiments disclosed herein may include the use of a special purpose or general-purpose computer including various computer hardware or software modules, as discussed in greater detail below. A computer may include a processor and computer storage media carrying instructions that, when executed by the processor and/or caused to be executed by the processor, perform any one or more of the methods disclosed herein.

As indicated above, embodiments within the scope of the present invention also include computer storage media, which are physical media for carrying or having computer-executable instructions or data structures stored thereon. Such computer storage media can be any available physical media that can be accessed by a general purpose or special purpose computer.

By way of example, and not limitation, such computer storage media can comprise hardware such as solid state disk (SSD), RAM, ROM, EEPROM, CD-ROM, flash memory, DRAM, phase-change memory ("PCM"), or other optical disk storage, magnetic disk storage or other magnetic storage devices, or any other hardware storage devices which can be used to store program code in the form of computer-executable instructions or data structures, which can be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts disclosed herein are disclosed as example forms of implementing the claims.

As used herein, the term 'module' or 'component' can refer to software objects or routines that execute on the computing system. The different components, modules, engines, and services described herein may be implemented as objects or processes that execute on the computing system, for example, as separate threads. While the system and methods described herein can be implemented in software, implementations in hardware or a combination of software and hardware are also possible and contemplated. In the present disclosure, a 'computing entity' may be any computing system as previously defined herein, or any module or combination of modules running on a computing system.

In at least some instances, a hardware processor is provided that is operable to carry out executable instructions for performing a method or process, such as the methods and processes disclosed herein. The hardware processor may or may not comprise an element of other hardware, such as the computing devices and systems disclosed herein. A controller may include a processor and memory and/or other computing chips.

In terms of computing environments, embodiments of the invention can be performed in client-server environments, whether network or local environments, or in any other suitable environment. Suitable operating environments for at least some embodiments of the invention include cloud computing environments where one or more of a client, server, or target virtual machine may reside and operate in a cloud environment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for writing data to a data structure implemented in a flash memory, the method comprising:
   receiving a write request from a client at the flash memory, wherein the flash memory includes a controller and a library that includes a plurality of calls that are performed by the controller, wherein the controller is configured to perform the write request, and wherein the write request is to write an update to a data structure stored in the flash memory in accordance with a particular call;
   determining, by the controller, how to implement the write request in the flash memory, wherein the controller overwrites a location in the flash memory when an overwrite operation can be performed, wherein the update is written to an in-memory table or to a new location in the flash memory when the overwrite operation cannot be performed.

2. The method of claim 1, wherein the particular call is specified by the client in the write request.

3. The method of claim 1, wherein the particular call is determined by the controller.

4. The method of claim 1, wherein the write request includes the update and a location in the flash memory.

5. The method of claim 1, wherein the overwrite operation is performed when the write request only requires setting bits.

6. The method of claim 1, further comprising flushing contents of the in-memory table to the flash memory, wherein the contents are written to new locations in the flash memory when flushing the contents.

7. The method of claim 1, wherein the particular call is a logical OR operation or a compare and swap operation.

8. The method of claim 1, wherein the data structure includes a data portion and a pointer portion, wherein the data portion and the pointer portion can by overwritten independently.

9. A non-transitory computer readable medium comprising computer executable instructions that, when executed by a processor, perform a method for writing data to a data structure implemented in a flash memory, the method comprising:
   receiving a write request from a client at the flash memory, wherein the flash memory includes a controller and a library that includes a plurality of calls that are performed by the controller, wherein the controller is configured to perform the write request wherein the write request is to write an update to a data structure stored in the flash memory in accordance with a particular call;
   determining, by the controller, how to implement the write request in the flash memory, wherein the controller overwrites a location in the flash memory when an overwrite operation can be performed, wherein the update is written to an in-memory table or to a new location in the flash memory when the overwrite operation cannot be performed.

10. The non-transitory computer readable medium of claim 9, wherein the particular call is specified by the client in the write request.

11. The non-transitory computer readable medium of claim 9, wherein the particular call is determined by the controller.

12. The non-transitory computer readable medium of claim 9, wherein the write request includes the update and a location in the flash memory.

13. The non-transitory computer readable medium of claim 9, wherein the overwrite operation is performed when the write request only requires setting bits.

14. The non-transitory computer readable medium of claim 9, further comprising flushing contents of the in-memory table to the flash memory, wherein the contents are written to new locations in the flash memory when flushing the contents.

15. The non-transitory computer readable medium of claim 9, wherein the particular call is a logical OR operation or a compare and swap operation.

16. The non-transitory computer readable medium of claim 9, wherein the data structure includes a data portion and a pointer portion, wherein the data portion and the pointer portion can by overwritten independently.

17. A method for reading data from a data structure implemented in a flash memory, the method comprising:
- receiving a read request from a client at the flash memory for data stored in a data structure, wherein the read request includes a location in the data structure, wherein the flash memory is associated with a library and a controller that are configured to support write requests and read requests, wherein the library includes a plurality of calls configured to perform the read requests and the write requests in the flash memory;
- reading the data from the data structure at the location in the data structure stored in the flash memory;
- applying updates to the data that are stored in an in-memory table, wherein the updates stored in the in-memory table correspond to writes to the requested data that were stored in the in-memory table instead of being written to the flash memory; and
- returning the updated data to the client in response to the read request.

18. The method of claim 17, wherein the controller determines a particular call for the read request.

19. The method of claim 17, wherein the client specifies a particular call for the read request.

20. The method of claim 17, further comprising flushing the updates to the flash memory.

* * * * *